United States Patent [19]
Lynch et al.

[11] 3,932,934
[45] Jan. 20, 1976

[54] METHOD OF CONNECTING TERMINAL POSTS OF A CONNECTOR TO A CIRCUIT BOARD

[75] Inventors: James Edward Lynch, Harrisburg; David Francis Fussleman, Middletown, both of Pa.

[73] Assignee: AMP Incorporated, Harrisburg, Pa.

[22] Filed: Sept. 16, 1974

[21] Appl. No.: 506,153

[52] U.S. Cl. .................. 29/628; 29/484; 29/500; 29/630 D
[51] Int. Cl.² .................................. H01R 43/00
[58] Field of Search .......... 29/630 D, 630 B, 630 R, 29/628, 484, 500, 501, 203 P, 203 R, 418, 423; 174/88 R, 94 R; 228/56

[56] References Cited
UNITED STATES PATENTS

| | | | |
|---|---|---|---|
| 2,701,411 | 2/1955 | Paine | 29/630 D |
| 3,002,481 | 10/1961 | Hutters | 228/56 |
| 3,396,894 | 8/1968 | Ellis | 228/56 |
| 3,591,922 | 7/1971 | Pardee | 29/628 |
| 3,744,129 | 7/1973 | Dewey | 29/628 |
| 3,781,986 | 1/1974 | Joslyn et al. | 29/630 D |
| 3,849,873 | 12/1974 | Coffin | 29/203 P |

Primary Examiner—C. W. Lanham
Assistant Examiner—James R. Duzan
Attorney, Agent, or Firm—William J. Keating, Esq.; Donald W. Phillion, Esq.

[57] ABSTRACT

A method of connecting the terminal posts of a connector into holes in a circuit board comprising the steps of inserting solder elements, which can have the shape of a doughnut or torus, for example, around each terminal post; inserting a piece of material, such as a strip of plastic or a Styrofoam material rod having a width or diameter greater than the distance between the two rows of terminal posts, in between said two rows of terminal posts to hold the solder elements on the posts; inserting the terminal posts in the holes prepared therefor in the circuit board; removing the strip or rod of material; further inserting, if necessary, the terminal posts into the circuit board holes; and heating the solder doughnuts by appropriate means while the terminal posts are pointed downwardly, that is with the circuit board below the connector, to reflow the solder into the spaces between the holes in the circuit board and the terminal posts therein.

6 Claims, 3 Drawing Figures

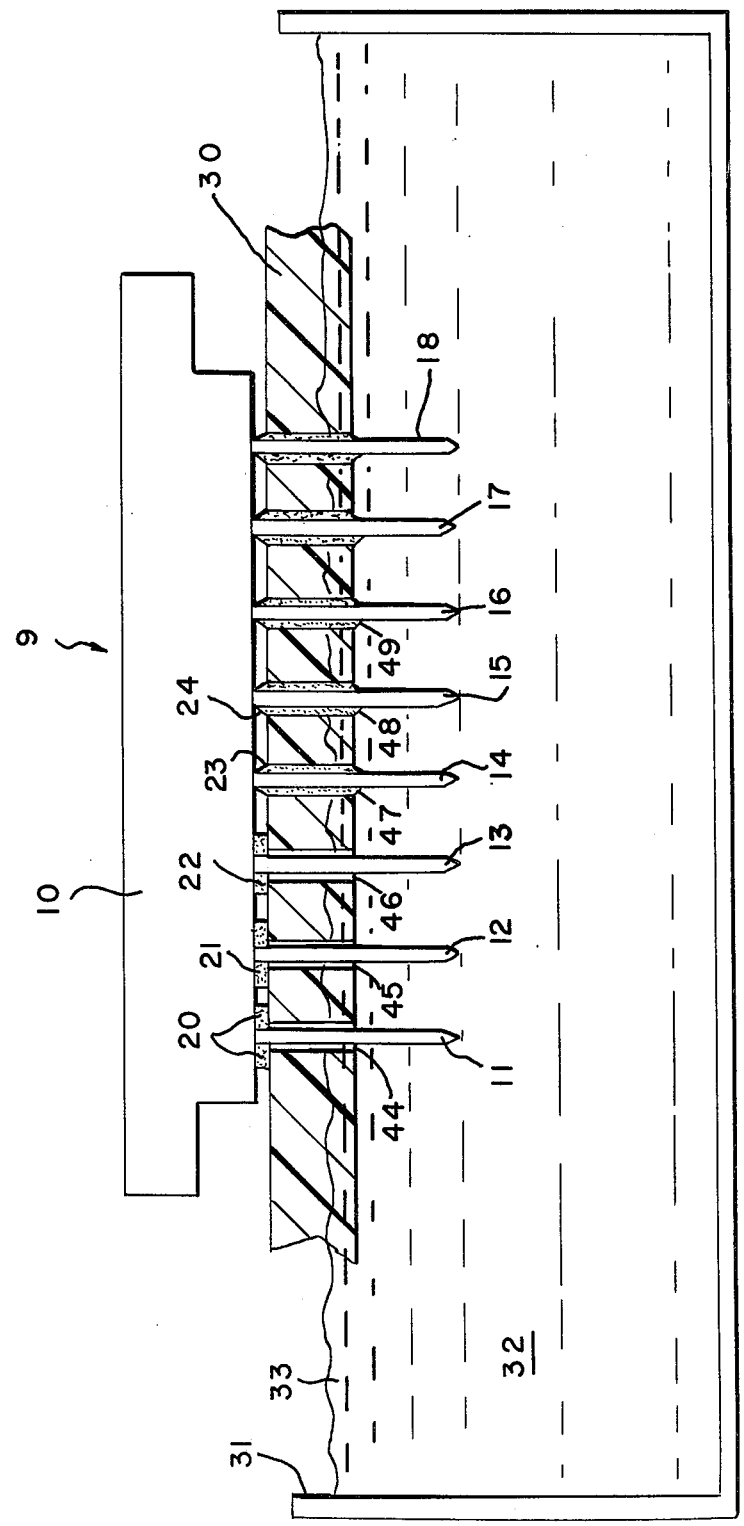

METHOD OF CONNECTING TERMINAL POSTS OF A CONNECTOR TO A CIRCUIT BOARD

BACKGROUND OF THE INVENTION

This invention relates generally to a method for connecting the terminal posts of a connector to a substrate, such as a printed circuit board, and more particularly it relates to a method of soldering said connector terminal posts to a plated through hole of a printed circuit board.

Connectors having a plurality of terminal posts which fit through holes in printed circuit boards are in extensive use today and have many different applications. One such application is, for example, the connection of one circuit board to another circuit board. A connector for this purpose usually consists of a row of pairs of contacts aligned so that the spacing between the contacts forms a slot which can receive the edge of a first printed circuit board. The other ends of the contacts are formed into terminal posts which are intended to extend through holes in a second printed circuit board. A plastic housing is usually provided to hold the pairs of contacts in a fixed position with respect to each other and for insulative purposes. In this type connector the posts usually consists of a plurality of pairs of posts which form two rows of posts. The terminal posts of the connector are pushed or pulled through the holes in the second printed circuit board and often are soldered into place. However, the percentage of acceptable soldered connections between the posts and the printed circuit board is not always as high as desired. It is desirable that the solder flow in and around the post and completely through the hole. In other words, the solder should completely fill up the hole around the posts. One widely used method of soldering such posts to printed circuit boards is by wave soldering wherein the bottom of the printed circuit board with the terminal post extending therethrough is positioned just below the surface of a pool of hot solder which is pulled up into the spaces between the posts and the sidewalls of the hole in the printed circuit board by such phenomena as surface tension or capillary action, or a combination of both. Often times, however, the solder does not rise sufficiently far up into the hole of the printed circuit, leaving a comparatively weak solder joint with a high probability of failure under stress at a later date when in actual use.

Another technique is to insert the terminal post through the hole of the printed circuit board and then place a solder doughnut (i.e., a torus shaped piece of solder) around each terminal post where it extends through the printed circuit board. The solder toruses are then melted by suitable heating means and flows into the hole in and around the terminal post. However, the problem of individually placing solder doughnuts on each of the terminal posts after they have been inserted through their mating hole in the printed circuit board is a time-consuming one and quite expensive.

BRIEF STATEMENT OF THE INVENTION

It is a primary object of the present invention to enable the use of solder doughnuts around each terminal post of a connector without the necessity of an operator manually placing a doughnut on each individual terminal post.

It is a further object of the invention to be able to apply solder doughnuts to terminal posts by automated means before said terminal posts are inserted into the printed circuit board so that the solder doughnuts are positioned in between the connector housing and the printed circuit board.

It is a further aim of the invention to provide a method of manufacturing connectors having terminal posts and to enable shipment of these connectors with solder doughnuts already installed on said terminal posts so that a manufacturer can later install said connectors upon a printed circuit board with the solder doughnuts remaining on said terminal posts during said installation.

It is a further object of the invention to provide a method of connecting a terminal post of a connector to a printed circuit board by means of solder doughnuts positioned between the connector housing and the printed circuit board and in which the connector can be inserted in such printed circuit boards without the solder doughnuts falling off, even with the terminal posts pointed downwardly, and yet permitting the solder doughnuts to eventually come to rest upon the surface of the printed circuit board where they can be melted and reflowed into the hole around the terminal post.

A fifth purpose of the invention is the improvement of means for connecting the terminal posts of a connector to a circuit board generally.

In accordance with the invention the soldering of the connector terminal posts to the printed circuit board is accomplished by the following steps: positioning the connector with the terminal posts pointed upwardly, installing a solder doughnut or solder washer around each terminal post by automated means such as a vibrating type feed mechanism, placing a strip of resilient material, such as paper or plastic, having a width greater than the distance between the two rows of terminal posts between the terminal posts so that the cross-sectional configuration of the paper is generally U-shaped and will press against the inner sides of the two rows of terminal posts to hold the solder doughnuts upon said terminal posts, inserting the terminal posts of the connector in mating holes in a printed circuit board, removing said strip of material from in between the rows of terminal posts to permit the solder doughnuts to fall upon the surface of the printed circuit board, pushing the terminal posts the remaining distance into the holes of the printed circuit board, and heating the solder doughnuts by appropriate means to cause the solder to reflow into the space between the walls of the holes and the terminal posts.

In accordance with another form of the invention the solder doughnuts are held on the posts by dimples formed on the posts. The solder toruses are forced past the dimples which are positioned near the end of the posts so they will pass into the circuit board before heating and thereby will not impede the solder torus from falling on the board surface.

In accordance with a feature of the invention, the heating of the solder doughnuts can be accomplished by immersing the printed circuit board into a vat of hot oil with the terminal posts pointed downwardly. Other heating means such as R-F radiation, ultrasonics or infra-red can also be employed.

BRIEF DESCRIPTION OF THE DRAWINGS

The above-mentioned and other objects and features of this invention will be more fully understood from the following detailed description thereof when read in conjunction with the drawings in which:

FIG. 3 shows the connector fully inserted into the printed circuit board with the piece of material having been previously removed therefrom and further with the printed circuit board being immersed in a vat of hot oil to reflow the solder.

DETAILED DESCRIPTION OF THE INVENTION

Figure 1:
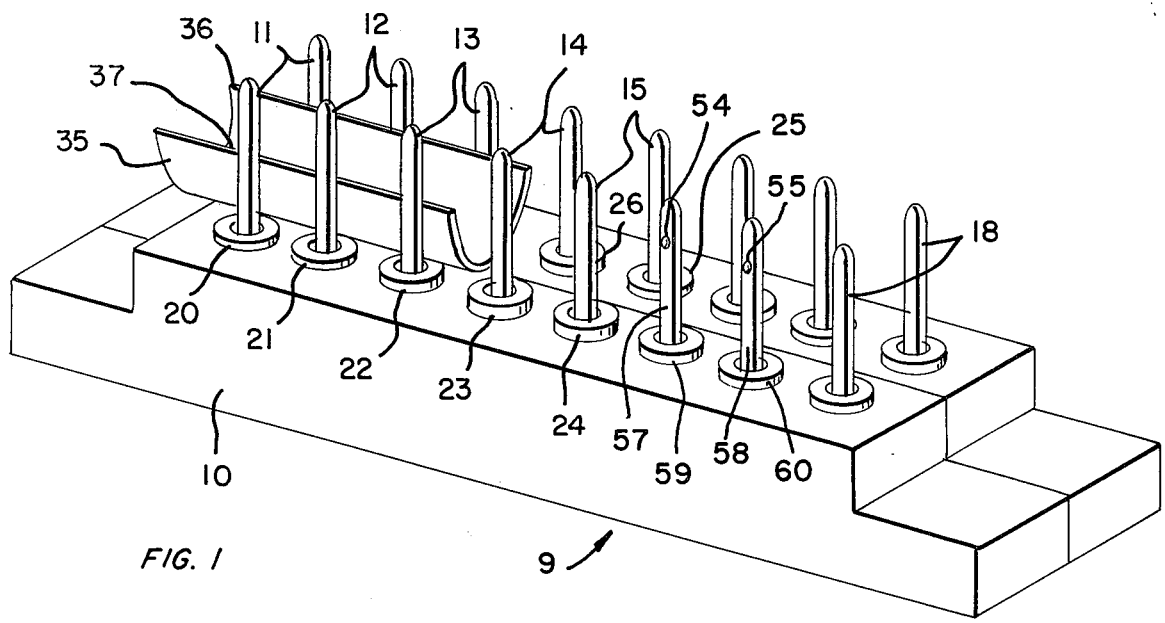
FIG. 1 shows a connector in an inverted position with solder doughnuts already applied and with a thin piece of resilient material inserted in between the two rows of terminal posts.

Referring now to FIG. 1, the connector 9 is comprised of a housing 10 having a plurality of terminal posts, such as pairs of terminal posts 11, 12, 13, 14 and 15 extending therefrom. The connector 9 is shown in an inverted position, that is, with the terminal posts extending upwardly. Around each terminal post a solder doughnut is placed, such as solder toruses 20, 21, 22, 23, 24 and 25 and 26. In lieu of torus-shaped solder elements, washer shaped or even square or rectangularly shaped solder elements could be employed. Although desirable, it is not absolutely necessary that the solder elements extend completely around the terminal post. A strip of resilient material 35, which can be paper or plastic or any other flexible material with some stiffness thereto, is placed in between the two rows of contacts as shown in FIG. 1. The width of the strip of material 35 is greater than the distance between the two contacts of each pair, as for example, the distance between the pair of contacts 11. Thus, the strip of material 35 will assume the U-shaped cross-sectional configuration, as shown in FIG. 1, with the edges 36 and 37 thereof pressing against the insides of the two rows of terminal posts. In this manner the solder doughnuts 20 through 26 are held onto the terminal posts even though the connector 9 should be turned upright, that is with the terminal posts extending downwardly. There is sufficient friction between the edges of the strip of material 35 and the terminal posts 11 through 15 so that strip 35 will not fall out and will not permit the solder doughnuts to fall off regardless of the position of the connector 9.

It is to be understood that the strip of material 37 is not necessarily a flat sheet of material. Equivalents of strip 37 would include a straw-shaped element or a solid element of resilient or compressible material, such as a rod of Styrofoam type material, which could be inserted in between the rows of posts and remain there by friction means during shipping or assembly of the connector into a circuit board, and then pulled out before solder reflow occurs. Other equivalents of strip 37 could have different shaped cross sectional configurations which might or might not be uniform over the length thereof.

Figure 2:
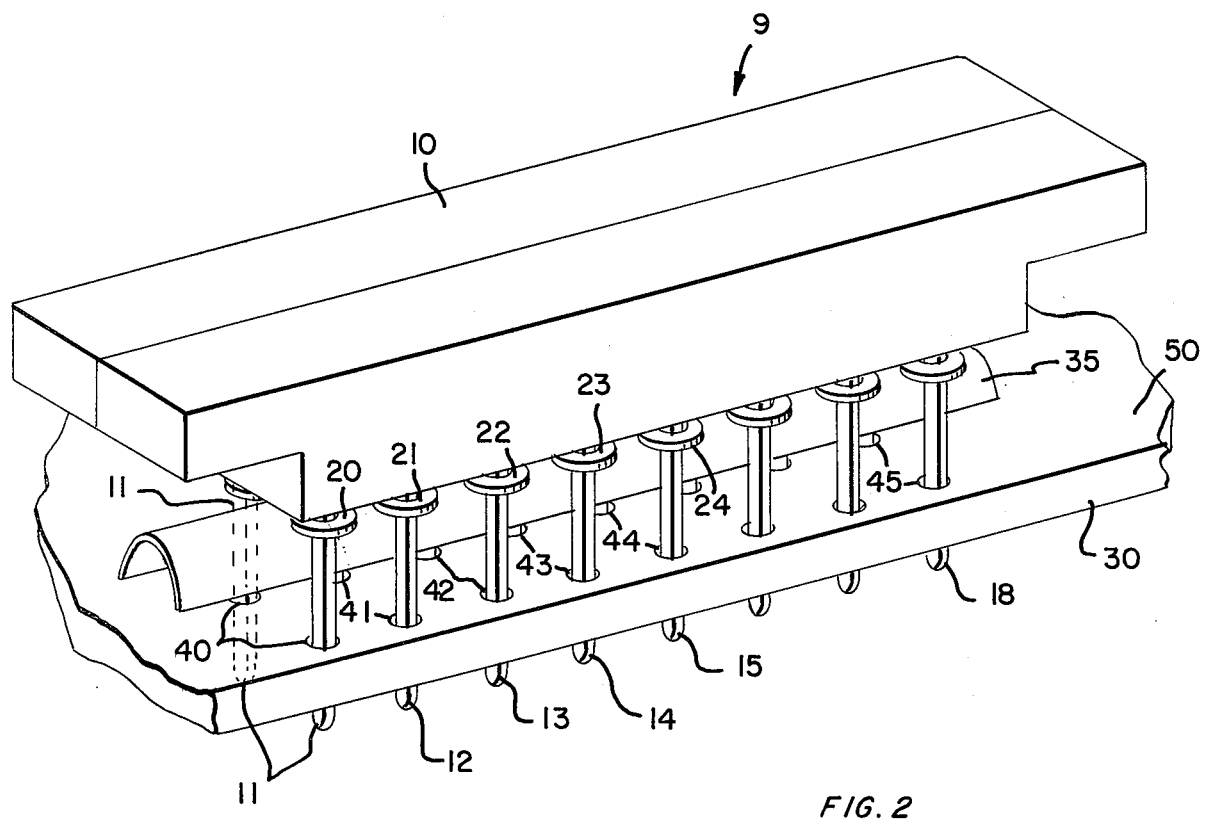
FIG. 2 shows a terminal post of a connector partially inserted into a printed circuit board and with the thin piece of material still positioned between the two rows of terminal posts.

Referring now to FIG. 2 the connector 9 is shown with its terminal posts, such as terminals 11 through 15 and 18 partially inserted through apertures 40 to 45 in printed circuit board 30. The strip of material 35 is still positioned in between the two rows of terminal posts. The solder doughnuts, such as solder doughnuts 20, 21, 22, 23 and 24 are still held on the terminal posts between the strip 35 and the housing 10 of connector 9. The next step is the removal of strip 35, which is done simply by taking hold of one end thereof and pulling it out from between the two rows of terminal posts. The solder doughnuts, such as solder doughnuts 20 through 24, will then drop by gravity onto the surface 50 of the terminal board 30.

The terminal posts 40 through 45 of the connector 9 can then be completely inserted through the holes 40 through 45 of the printed circuit board 30. The assembly is now ready for reflowing the solder, that is, for melting the solder doughnuts and causing the liquid solder to flow down into the hole and around the terminal posts, such as terminal posts 11 through 15, both by gravity means and by capillary action.

Reference is made to FIG. 3 which shows one method of heating the solder doughnuts. The assembly, including the connector 9, the printed circuit board 30 and the solder doughnuts 20 through 24, is partially immersed in a pool of hot oil held in container 31.

It is not necessary to completely immerse the assembly into the hot oil. It is necessary only to immerse enough of the printed circuit board and the terminal posts in order to heat the solder doughnuts 20 through 24 to their melting point. It is apparent from FIG. 3 that the heat will conduct through the metal terminal posts 11 through 18 up into the solder doughnuts 20 through 24. As the solder doughnuts melt they will flow down into the holes 44 through 49 of printed circuit board 30. Experimental data has shown that over 99 percent of the connections are such that the spaces between the walls of the holes in the printed circuit board 30 and the terminal posts therein are completely filled with solder. Those very few holes which do not completely fill with the solder are almost completely filled with solder and in fact form excellent electrical and mechanical connection.

For purposes of illustration, some of the solder doughnuts are represented in FIG. 3 as not yet having been melted while others are represented as having been melted and reflowed into the hole in the board 30. More specifically, solder doughnuts 20, 21 and 22 are shown before melting has occurred. The spacing between the terminals 11, 12, 13 and the holes 44, 45 and 46 in printed circuit board 30 can also be seen.

The condition after reflowing of the solder doughnuts has occurred is shown around terminal posts 14, 15, 16, 17 and 18. For example, considering terminal post 14 specifically, the solder doughnut has melted and flowed into the hole 47 to form the configuration 23. Similarly, around terminal post 15 the solder doughnut has melted to form the configuration 24 which fills the hole 48 in printed circuit board 30.

Referring again to FIG. 1 the solder toruses can be held on the terminal posts by other means, such as dimples 54 and 55 formed on terminal posts 57 and 58. The solder doughnuts 59 and 60 are forced onto the posts 57 and 58 past the dimples 54 and 55 which will retain said doughnuts 59 and 60 thereon even though the connector of FIG. 1 is inverted. However, the dimples 54 and 55 are located near the ends of posts 57 and 58 so that they will be inserted into the printed circuit board before melting of the solder. Thus the dimples 54 and 55 will not impede the solder toruses 59 and 60 from falling onto the circuit board surface before melting thereof.

It is to be understood that the forms of the invention shown and described herein are but preferred embodiments thereof and that various changes can be made in the steps of the method without departing from the

We claim:

1. A method of securing the terminal posts of a connector having a housing and at least two rows of terminal posts into holes prepared therefor in a circuit board substrate and comprising the steps of:
   inverting said connector with the terminal posts pointed upwardly;
   slipping a solder element around selected ones of said terminal posts;
   inserting a slip of resilient material between said rows of terminal posts;
   said slip of material having a width sufficient to span the distance between said rows of terminal posts and to press against the inner surfaces of said terminal posts to lock said solder elements on said terminal posts between said slip of material and said connector housing;
   inserting said terminal posts at least part way into said holes prepared therefor in said circuit board substrate;
   extracting said slip of material from between said rows of terminal posts;
   melting said solder elements while said terminal posts are pointed downwardly.

2. A method of assembling together a substrate and a connector with said connector comprising a housing and at least two rows of terminal posts secured therein which fit into holes prepared therefore in said substrate and comprising the steps of:
   slipping a solder element around at least selected ones of said terminal posts;
   inserting a slip of resilient material having a width greater than the distance between said rows of terminal posts, between said rows of terminal posts with the solder elements being positioned between said slip of resilient material and said connector housing;
   said slip of material positioned to have its width span the distance between said terminal posts to retain said solder elements on said terminal posts between said slip of material and said connector housing;
   inserting said terminal posts into the holes prepared therefor in said substrate;
   extracting said slip of material from between said rows of terminal posts;
   melting said solder elements while said terminal posts are positioned to form an angle less than 90° with the direction of the pull of gravity.

3. A method of securing the terminal posts of a connector having a housing and at least two rows of terminal posts into holes prepared therefor in a circuit board substrate and comprising the steps of:
   inverting said connector to position said terminal posts at an angle greater than 90° with respect to the direction of the pull of gravity;
   slipping a torus shaped piece of solder around selected ones of said terminal posts;
   inserting a slip of resilient material between said rows of terminal posts;
   said slip of material having a width greater than the distance between said rows of terminal posts and positioned to have said width span the distance between said rows of terminal posts and press against the inner surfaces of said terminal posts to retain said solder toruses on said terminal posts between said slip of material and said connector housing;
   inserting said terminal posts part way into said holes prepared therefor in said circuit board substrate;
   extracting said slip of material from between said rows of terminal posts;
   heating said terminal posts to a temperature above their melting temperature, while said terminal posts are forming an angle less than 90° with the direction of the pull of gravity.

4. A method of assembling together a substrate and a connector with said connector comprising a housing and at least two rows of terminal posts secured therein which fit into holes prepared therefore in said substrate and comprising the steps of:
   slipping a torus shaped piece of solder around selected ones of said terminal posts;
   inserting a slip of resilient material between said rows of terminal posts;
   said slip of material having a width more than sufficient to span the distance between said terminal posts to retain said solder toruses on said terminal posts between said slip of material and said connector housing;
   inserting said terminal posts at least part way into the holes prepared therefor in said substrate;
   extracting said slip of material from between said rows of terminal posts;
   heating said assembly to melt said solder toruses while said terminal posts are positioned to form an angle less than 90° with the direction of pull of gravity.

5. A method of securing the terminal posts of a connector having a housing and at least two rows of terminal posts into holes prepared therefor in a circuit board substrate and comprising the steps of:
   inverting said connector to position said terminal posts at an angle greater than 90° with respect to the direction of the pull of gravity;
   slipping a solder element around selected ones of said terminal posts;
   inserting a length of compressible material between said rows of terminal posts;
   said length of material having a width greater than the distance between said rows of terminal posts and positioned to have said width span the distance between said rows of terminal posts and press against the inner surfaces of said terminal posts to retain said solder element on said terminal posts between said length of compressible material and said connector housing;
   inserting said terminal posts part way into said holes prepared therefor in said circuit board substrate;
   extracting said length of compressible material from between said rows of terminal posts;
   heating said terminal posts to a temperature which will melt said solder elements above their melting temperature, with said terminal posts forming an angle less than 90° with the direction of the pull of gravity while being so heated.

6. A method of assembling together a substrate and a connector with said connector comprising a housing and at least two rows of terminal posts secured therein which fit into holes prepared therefore in said substrate and comprising the steps of:
   slipping a solder element around selected ones of said terminal posts;
   inserting a length of compressible material between said rows of terminal posts;

said length of material having a width more than sufficient to span the distance between said terminal posts to retain said solder elements on said terminal posts between said length of material and said connector housing;

inserting said terminal posts at least part way into the holes prepared therefor in said substrate;

extracting said length of material from between said rows of terminal posts;

heating said assembly to melt said solder elements while said terminal posts are positioned to form an angle less than 90° with the direction of pull of gravity.

* * * * *